(12) United States Patent
Henriksson et al.

(10) Patent No.: US 6,754,293 B1
(45) Date of Patent: Jun. 22, 2004

(54) METHOD AND CIRCUIT ARRANGEMENT FOR PROCESSING A SIGNAL CONTAINING INTERFERENCE

(75) Inventors: Jukka A. Henriksson, Espoo (FI); Kimmo J. Raivio, Vantaa (FI)

(73) Assignee: Nokia Mobile Phones, Ltd., Salo (FI)

(*) Notice: Subject to any disclaimer, the term of this patent is extended or adjusted under 35 U.S.C. 154(b) by 0 days.

(21) Appl. No.: 08/655,633

(22) Filed: May 30, 1996

(30) Foreign Application Priority Data

Jun. 1, 1995 (FI) .................................................. 952674

(51) Int. Cl.[7] .............................. H04B 1/10; H03H 7/30
(52) U.S. Cl. ....................... 375/346; 375/233; 375/350; 708/323
(58) Field of Search ................................ 375/232, 233, 375/340, 341, 346, 348, 350; 708/319, 322, 323

(56) References Cited

U.S. PATENT DOCUMENTS

| | | | |
|---|---|---|---|
| 4,973,923 A | 11/1990 | Kuisma | 332/117 |
| 5,124,672 A | 6/1992 | Kuisma | 332/103 |
| 5,231,364 A | 7/1993 | Mucke | 332/105 |
| 5,311,151 A | 5/1994 | Vaisanen | 332/105 |
| 5,345,476 A * | 9/1994 | Tsujimoto | 375/233 |
| 5,357,221 A | 10/1994 | Matero | 332/123 |
| 5,371,481 A | 12/1994 | Tiittanen et al. | 332/103 |
| 5,392,460 A | 2/1995 | Mattila et al. | 455/76 |
| 5,446,422 A | 8/1995 | Mattila et al. | 332/103 |
| 5,469,126 A | 11/1995 | Murtojarvi | 332/105 |
| 5,604,769 A * | 2/1997 | Wang | 375/229 |

FOREIGN PATENT DOCUMENTS

| | | |
|---|---|---|
| EP | 0 465 851 A2 | 1/1992 |
| EP | 0 574 223 A1 | 12/1993 |
| WO | WO 89/12360 | 12/1989 |
| WO | WO 93/00761 | 1/1993 |

* cited by examiner

*Primary Examiner*—Young T. Tse
(74) *Attorney, Agent, or Firm*—Perman & Green, LLP

(57) ABSTRACT

The invention relates to a method and circuit arrangement for compensating for an interference component included in a signal in a digital transmission system such as a mobile communication system, radio system or television system. In the method according to the invention a decision error representing an interfering signal is classified using an adaptive method, and a table is drawn up of interference estimates corresponding to classified decision errors. So it is obtained on the basis of previous decision errors an interference estimate corresponding to the next signal sample and that estimate is subtracted from the signal sample before the current decision. The adaptive method is preferably a neural method such as a self-organizing map. With the method according to the invention it is possible to compensate for an interference component in a signal regardless of the interference source assuming that the interfering signal has internal correlation. If required, it is also possible to include in the method according to the invention equalization for delayed payload signal components.

30 Claims, 5 Drawing Sheets

METHOD AND CIRCUIT ARRANGEMENT FOR PROCESSING A SIGNAL CONTAINING INTERFERENCE

The invention relates to a method and circuit arrangement for compensating for an interference component in a signal in a digital transmission system such as a mobile communication system, radio system or television system.

BACKGROUND OF THE INVENTION

In transmission systems, interference components, delayed components of the payload signal and noise are added to the signal transmitted. Transmission systems are beginning to employ digital modulation methods, of which especially multi-state modulation methods are susceptible to said added components, which may result in errors in the detection of a received signal. This is a significant problem both in transmission systems based on radio technology, such as mobile communication systems, and in transmission systems based on the use of physical lines, such as cable television systems.

Delayed components in the payload signal are mainly caused by the fact that the signal travels from the transmitter to the receiver via several routes. An interfering signal may originate in the transmission system itself, ie. the "payload system", or in another transmission system or electrical device.

For example, in mobile communication systems the number of channels available is limited and, therefore, several cells of a system have to share channels. Then, transmission activity in the nearby cells of a system results in an increase in the interference level.

Secondly, since there is a tendency to put as many frequency channels as possible on the frequency band available, the frequency difference of adjacent channels is small and, thereby, interference will also be caused by transmission activity on the adjacent channel. Then the interfering signal may come from the same or another cell in that system.

Interference similar to that mentioned above may also be caused by another transmission system operating on the same frequency band if the distance between the systems with respect to the transmission power used is not wide enough. Also radio transmitters operating on other frequency bands may transmit interfering frequency components at frequencies that deviate from their operating frequency. Electrical devices that are not designed to transmit radio signals may also cause interference on the transmission channel. The occurrence and nature of interference from sources outside the system vary and are therefore difficult to predict It is known to compensate for an interfering signal using linear filtering. The so-called Kalman filtering is an example of such known methods. In these methods, however, the nature of tie interfering signal is required to be known. Usually, the source of the interfering signal is assumed to be a system similar to the payload system. In addition, some methods require the symbol rates of the interfering signal and payload signal to be identical or the clock rates of the interfering and payload signals to be interlocked. Therefore, application of these methods is limited primarily to compensating for interference originating on the same or adjacent channel of a particular system. A further disadvantage of the linear prediction methods is a notable increase of noise.

It is known to use a transversal equalizer or decision feedback equalizer to equalize delayed signal components. Such equalizers are described e.g. in the following documents:

[1] Proakis, J. G.: Advances in Equalization for Intersymbol Interference, Advances in Communication Systems Theory and Applications, Vol 4, Academic Press, 1975 and

[2] Proakis, J. G.: Digital communications (1989) McGraw-Hill, Inc., New York, 905 pp.

In addition, it is known to use together with the equalizers mentioned above detection based on a self-organizing map (SOM), disclosed in patent document

[3] Henriksson, Raivio, Kohonen: Reception method and receiver for discrete signals, FI 85548.

However, equalizers used for compensating for delayed signal components cannot compensate for interference that does not correlate with the payload signal.

SUMMARY OF THE INVENTION

It is the object of the invention to create a method and circuit arrangement with which it is possible to compensate for an interference component included in a signal regardless of the interference source. If needed, it is also possible to include in the method according to the invention equalization for delayed payload signal components.

One of the ideas of the invention is that a decision error representing an interfering signal is classified using an adaptive method and a table is drawn up of interference estimates corresponding to the classified decision errors. So on the basis of previous decision errors it is obtained an interference estimate corresponding to the next signal sample, and that estimate is subtracted from the signal sample before the current decision. The adaptive method is preferably a neural method such as a self-organizing map.

With the method according to the invention it is possible to compensate for interfering signals that have internal correlation but which do not substantially correlate with the payload signal. Thus, with this method it is also possible to compensate for interfering signals with limited frequency bands the origin or characteristics of which are not known. Since the interference compensation is adapted to the extent of interference, the noise increase caused by the compensation is minimal.

It is characteristic of the method according to the invention that said interference estimate is produced with an adaptive method as a function of at least one previous decision and at least one previous uncompensated signal sample. It is characteristic of the circuit arrangement according to the invention that it comprises means for adaptively determining the interference estimate on the basis of at least one uncompensated signal sample and at least one previous decision.

Preferred embodiments of the present invention are described in the dependent claims.

BRIEF DESCRIPTION OF THE DRAWING

The invention is further described with reference to the attached drawing, where.

DETAILED DESCRIPTION OF THE INVENTION

Figure 2:
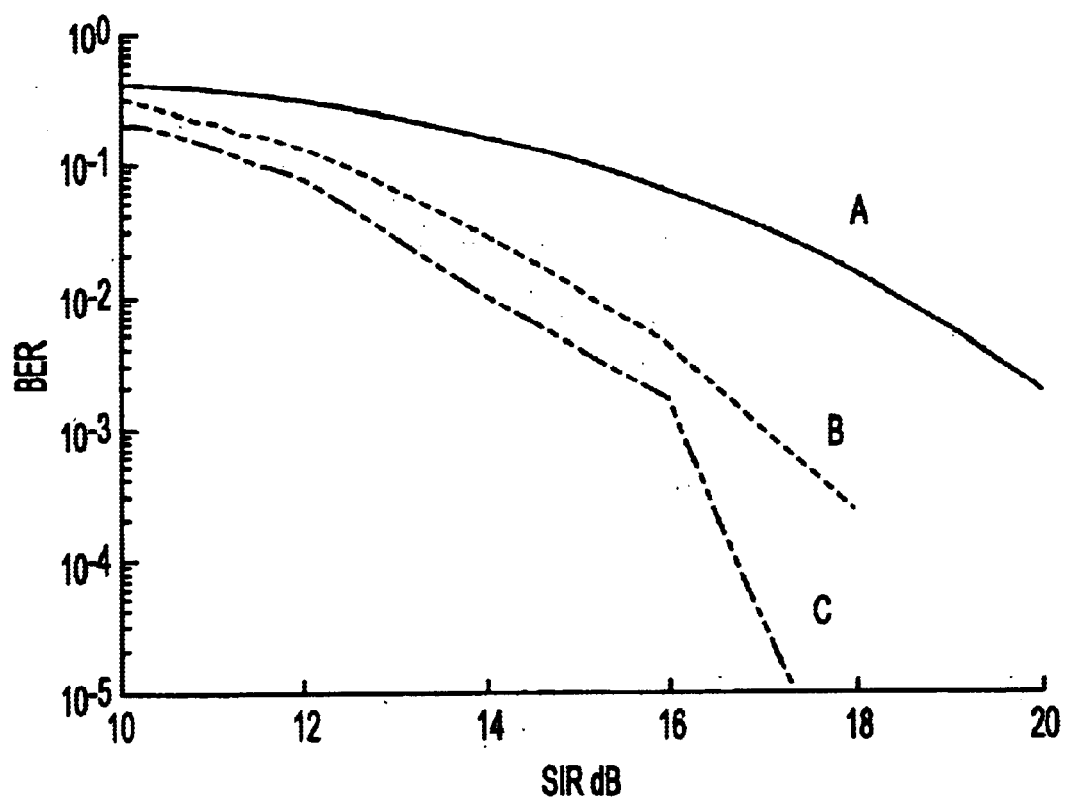
FIG. 2 shows the bit-error ratio obtained with a first and second embodiment of the invention as a function of the signal-interference ratio.
Figure 3:
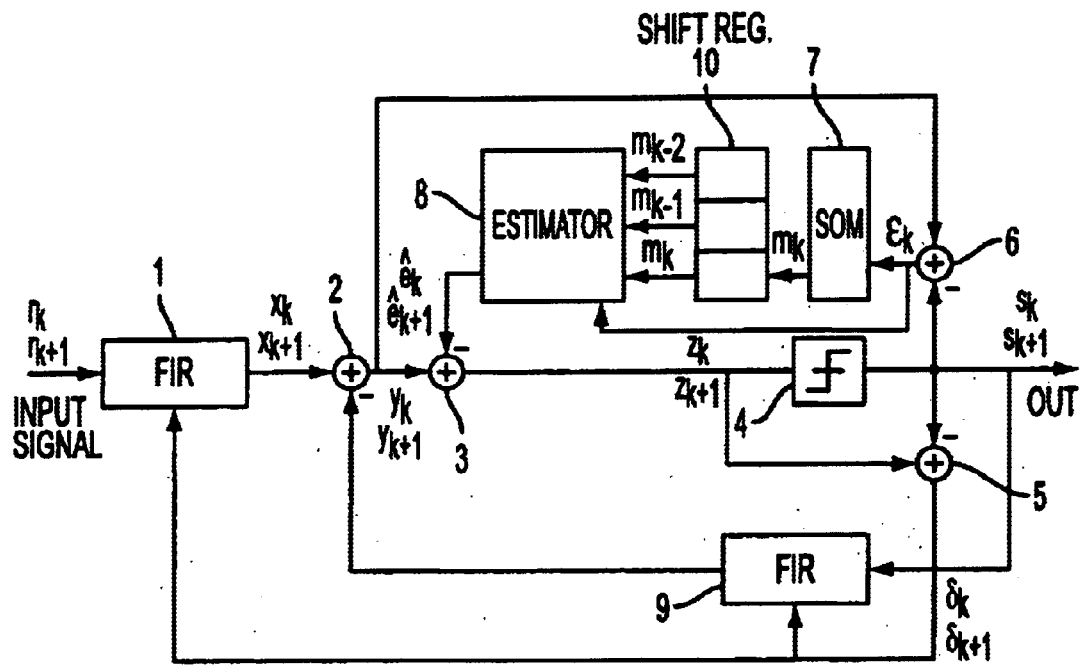
FIG. 3 shows the block diagram for the first embodiment of the method according to the invention.
Figure 4:
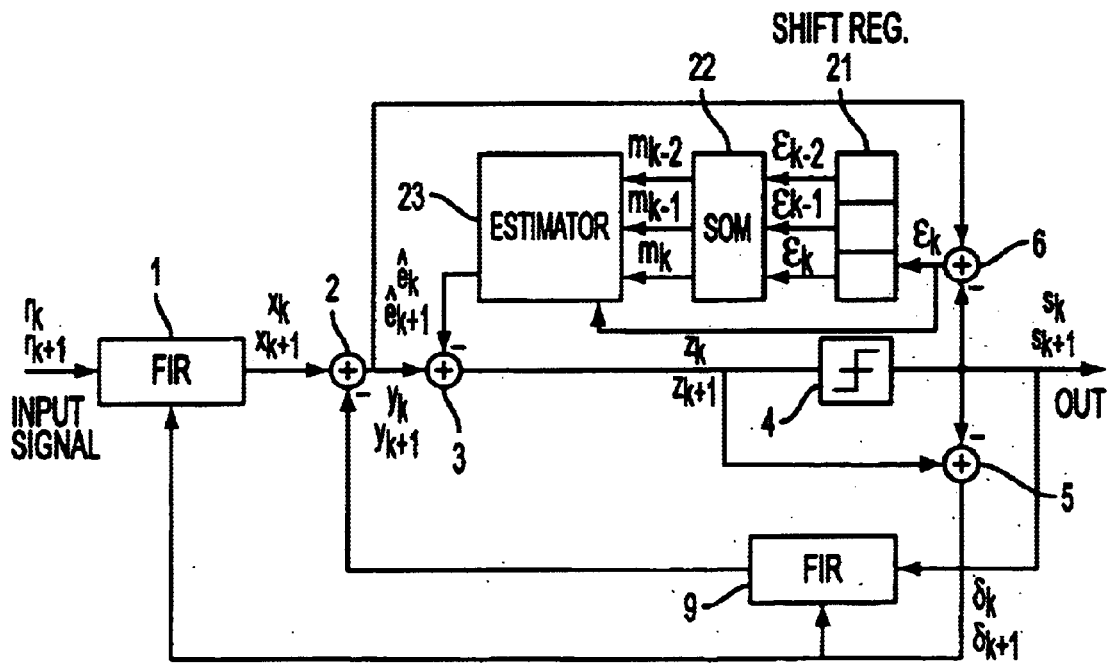
FIG. 4 shows the block diagram for the second embodiment of the method according to the invention.

The blocks in the figures are numbered as follows:
1 FIR filter of the transversal equalizer
2, 3, 5, 6 Adder
4, 31 Decision circuit
7 Self-organizing map (SOM)
8 Estimation block
9 FIR filter of the decision feedback equalizer
10 Shift register
11 Index converter
12 Combination map
13 Estimate register
14 Selector for estimate to be read
15, 16 Unit delay circuit
17, 19 Multiplier unit
18 Adder
20 Selector for estimate to be updated
21 Shift register
22 Self-organizing map (SOM)
23 Estimation block
30, 33 Switch
32 Error delay line Below will first describe in general the operating principle of the method according to the invention (FIGS. 1 and 2) and two preferable embodiments of the invention (FIGS. 3 and 4). Then we will show the operating principle of a self-organizing map, which is essential from the point of view of the invention, and show how it is applied in a method according to the invention (FIGS. 5 and 6), and then we will discuss the operation of the estimation block (FIG. 7). Finally a third embodiment of the invention (FIG. 8) is described, where intermediate samples are used for forming an estimate.

Figure 1:
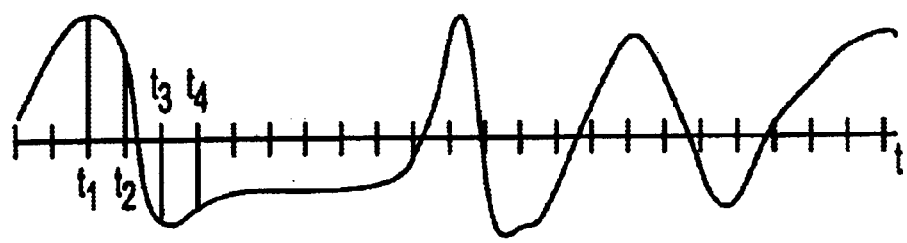
FIG. 1 shows an example of an interfering signal added to a payload signal.

FIG. 1 shows an example of a possible interfering signal added to a payload signal. The nature of the interfering signal is studied by taking samples from it at regular intervals at moments $t_1$, $t_2$ etc. The behaviour of a band-limited interference signal is such that on the basis of previous samples, e.g. the three preceding samples (say, $t_1$, $t_2$, $t_3$), it is possible to predict the next value ($t_4$), the accuracy of the prediction depending on the internal correlation of the interfering signal, When the interfering signal is a transmission signal of another system, it usually has high internal correlation, typically e.g. 0.9, when the value 1.0 corresponds to perfect correlation. In practice, it is possible to obtain a good compensation result with a lower interference signal correlation value, such as 0.8.

Interference compensation according to the invention is performed in connection with the detection of a digital signal such as a quadrature-amplitude-modulated (QAM) or pulse-amplitude-modulated (PAM) payload signal, with successive decisions on the signal made at least at the symbol rate of the payload signal. In the method according to the invention the values of the interference samples can be measured with the assumption that the decisions made in the digital detection of the signal were correct Then the difference of a decision and the input signal sample, ie. the decision error, includes three types of components: components that correlate with the payload signal, ie. mainly the delayed components of the payload signal components that do not correlate with the payload signal, ie. the interfering signal, and noise. Since components that correlate with the payload signal can be compensated for with methods known in prior art the decision error of a compensated signal is a good measurement value for interference signal samples provided that the noise is substantially weaker than the interfering signal.

The measurement values of previous interference signal samples can be used to predict the value of the next interference sample. According to the invention, an attempt is made to classify possible type transitions of the interfering signal and to base the prediction on those. It is preferable to use for the classification a neural method, particularly a self-organizing map (SOM), thereby achieving self-learning and adaptation to an arbitrary band-limited interference. The predicted estimate for the interference sample is subtracted from the signal before the final decision is made.

An interference estimate is often determined on the basis of several, e.g. three, previous interference samples. If N previous interference samples are used for determining the interference estimate, the classification of interference samples can be done separately for each interference sample and N last classification results can be used for selecting the estimate. Alternatively, it is possible to perform a concentrated classification for a vector formed of N samples and to use the resulting N-dimensional classification result in the estimate selection. The first method described above is the first embodiment of the invention and the second method is the second embodiment of the invention.

FIG. 2 shows a result of tests performed by the applicant in which the effect of the method according to the invention was measured. The figure shows the bit-error ratio BER of a detected signal as a function of the signal-interference ratio SIR without interference compensation (curve A), with compensation according to the first embodiment (curve B) and with compensation according to the second embodiment (curve C). The internal correlation of the interference signal in the measurement was 0.9.

FIG. 3 shows a block diagram of an arrangement according to the first embodiment of the invention, in which each interference sample is classified separately. The system receives complex signal samples $I_k$, where k represents the temporal order of the samples. These are filtered using a normal adaptive, linear transversal filter 1, preferably a finite impulse response (FIR) filter the tap coefficients of which are determined on the basis of a decision error obtained from an adder 5. The filtering result $x_k$ still contains some intersymbol interference of the payload signal as well as filtered interference.

Delayed components left in the signal are equalized with a decision feedback equalizer DFE which includes adders 2 and 5 and a FIR filter 9. The feedback path term of the decision feedback equalizer is subtracted from signal $x_k$ in adder 2. The equalized signal $y_k$ in the output of the adder represents a conventional DFE-equalized signal.

The interference signal estimate value $ê_k$ calculated on the basis of previous samples is subtracted from this signal in adder 3, giving the result $z_k$. The decision-making occurs in the decision circuit 4, and the decision may be a single-bit hard decision, a multiple-bit soft decision or an adaptive decision made using a self-organizing map. The difference signal $\delta_k = z_k - s_k$ between the decision circuit output and input is calculated in adder 5 and used both in the transversal filter and in the DFE equalizer.

The operation of the transversal filter, decision feedback equalizer and decision circuits, which, as such, are known, has been discussed in documents [1] and [2] mentioned above. A method employing a self-organizing map for making a decision has been discussed in the patent document [3] mentioned above.

In adder 6 it is performed a calculation typical of the method according to the invention for the difference quantity $\epsilon_k = y_k - s_k$ representing the sum value of the interference and noise at moment k. In the first embodiment of the invention, each sample $\epsilon_k$ is matched to a self-organizing map (SOM) 7, and a quantized decision $m_k$ is made using the map. Classification results obtained from the map are fed into a shift register 10 which provides as its outputs the N last classification results. In FIG. 3, N has the value of 3, but it can advantageously be anything between 2 and 5, depending on the application. In the estimation block 8, an estimate for the next interference sample $\epsilon_{k+1}$ is appended to the combination of the last classification results.

FIG. 4 shows a block diagram according to the second embodiment of the invention. Except for blocks 21, 22 and 23 its operation corresponds to that of the first embodiment described above. In the second embodiment there is first formed an N-dimensional sample vector of complex samples $\epsilon_k$ with in a shift register 21 before a self-organizing map 22. The map 22 is used for the classification of this vector. Each classification point $\{m_k, m_{k-1}, \ldots, m_{k-(N-1)}\}$ of the map has a corresponding estimate $\hat{e}_{k+1}$ in the estimation block 23, and this estimate value is subtracted from the sample $y_{k+1}$ in adder 3. When the next sample $\epsilon_{k+1}$ arrives in the shift register 22, the oldest value is discarded and the closest point on the map is obtained on the basis of the new contents of the shift register.

Thus, the first and the second embodiment differ from each other as concerns the definition and use of the self-organizing map. In the first embodiment, the decision is made and the map is updated on the basis of one sample $\epsilon_k$. The decisions are used to form a vector on the basis of which the estimate $\hat{e}_{k+1}$ is determined. An advantage of this method is that there is more data with respect to the map points for map updating. The number of map points may be small, say 16 or only 9.

In the second embodiment, an N-dimensional vector is formed, for the decision-making. Then the number of map points may be e.g. $16^3 = 4096$ in the three-dimensional case. Data for updating a given point comes then at rather long intervals and the updating of the map may take a long time. To some extent, this can be compensated for by defining the neighbourhood, which is to be updated, more extensive. In comparison with the first embodiment, an advantage of this method is more accurate observation of the characteristics of the interferences. On the other hand, in the method according to the first embodiment the need for memory and computation capacity for the map is considerably smaller, and it is therefore tie preferable embodiment for mobile communication and television system applications, for example.

Below it is described the operating principle of a self-organizing map (SOM) with reference to FIG. 5 which shows a 16-point 2-dimensional map. The SOM algorithm comprises two stages; sample classification (I) and map updating (II):

(I) For each discrete moment of time n it is obtained a "closest point" c in the map the parameter vector $m_i(n)$ of which is closest to the received signal sample $x(n)$, ie.

$$\|x(n)-m_c(n)\| = \min/i\ \{\|x(n)-m_i(n)\|\} \quad (2)$$

(II) The parameter vectors in the neighbourhood $N_c$ of the closest point c are updated:

$$m_i(n+1) = m_i(n) + \alpha[x(n) - m_i(n)], i = c \quad (3)$$

$$m_i(n+1) = m_i(n) + \beta[x(n) - m_i(n)], i \in N_c, i \neq c$$

$$m_i(n+1) = m_i(n), i \notin N_c$$

Here $\alpha$ and $\beta$ are the learning coefficients of the closest point c and its neighbours; $\|\ldots\|$ is the Euclidean distance. The neighbourhood $N_c$ can be determined e.g. such that it includes the closest point c and those adjacent points whose topological distance from the closest point c is not more than the square root of the dimension of the neighbourhood topology. This is a preferable neighbourhood definition for a mobile communication application, for example, since the computation capacity required is small but generally it is also possible to use multiples of said definition, for example.

Figure 5:
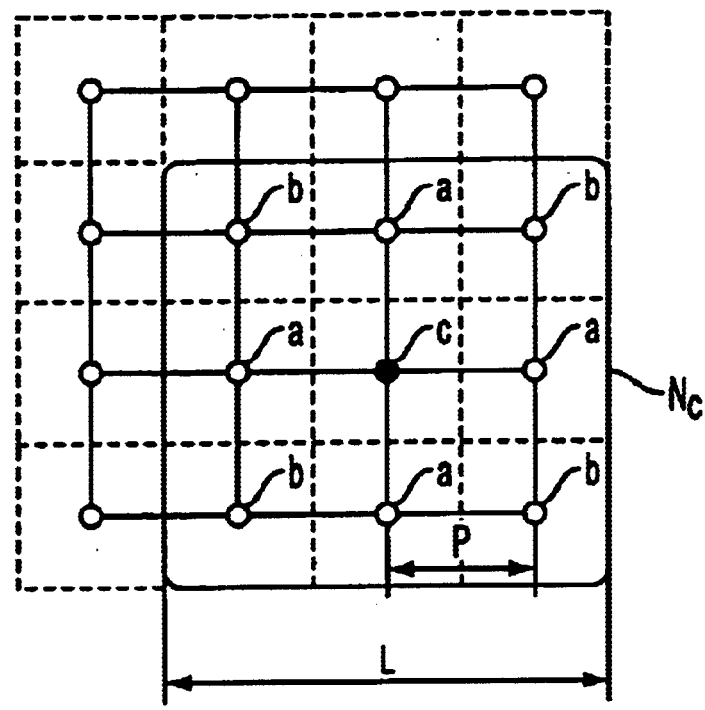
FIG. 5 shows a two-dimensional self-organizing map.

The radius P of the neighbourhood $N_c$, ie. the topological distance of an edge point in the neighbourhood of the closest point is 1 in the example shown in FIG. 5, but integers greater than that are also possible. By definition, the topological distance of edge neighbours a from the closest point c is 1. Then the topological distance of corner neighbours b is the square root of the dimension of the topology. If for example, the topology of the neighbourhood is 1-dimensional, there are two edge neighbours. Likewise, in the 2-dimensional neighbourhood $N_c$ shown in FIG. 5 there are four edge neighbours a and four corner neighbours b. When the dimension is greater than 3, the closest point has also neighbours other than the edge and corner neighbours mentioned above. The neighbourhood examined here is an n-dimensional hypercube having a closest point c in the middle. In FIG. 5, the width and length L of the neighbourhood $N_c$ is 3 in all directions when the radius P of the neighbourhood is 1. Correspondingly, if the radius were, say, 2, then the length in all directions would be 5.

The number of different neighbours is shown in the table below:

| Neighbour-hood dimension | Topological distance of neighbour from the closest point and number of neighbours | | | | Points in total |
|---|---|---|---|---|---|
| | 1 | $\sqrt{2}$ | $\sqrt{3}$ | $\sqrt{n}$ | |
| 1 | 2 | | | | 3 |
| 2 | 4 | 4 | | | 9 |
| 3 | 6 | 12 | 8 | | 27 |
| n | 2n | ... | ... | $2^n$ | $3^n$ |

The table illustrates a situation in which the closest point, the neighbours of which are being examined, is a so-called map interior point, in which case all the possible neighbours exist Should the point be a map edge point, there would be less neighbours than in the table above. Alternatively, the neighbourhood can be defined such that it includes only the edge neighbours a, ie. the points whose distance is 1.

When using a self-organizing map for interference cancellation, the received PAM signal is 1-dimensional and QAM signal 2-dimensional because a QAM signal includes in-phase component I and a quadrature component Q. Therefore, in the method according to the first embodiment, the self-organizing map is 1-dimensional when receiving a PAM modulated signal and 2-dimensional when receiving a QAM modulated signal.

Figure 6:
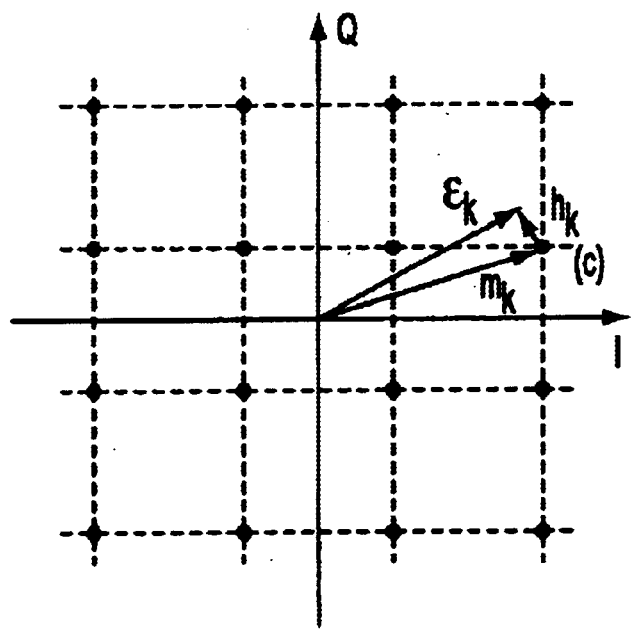
FIG. 6 illustrates classification of an interference sample with a self-organizing map.
Figure 7:
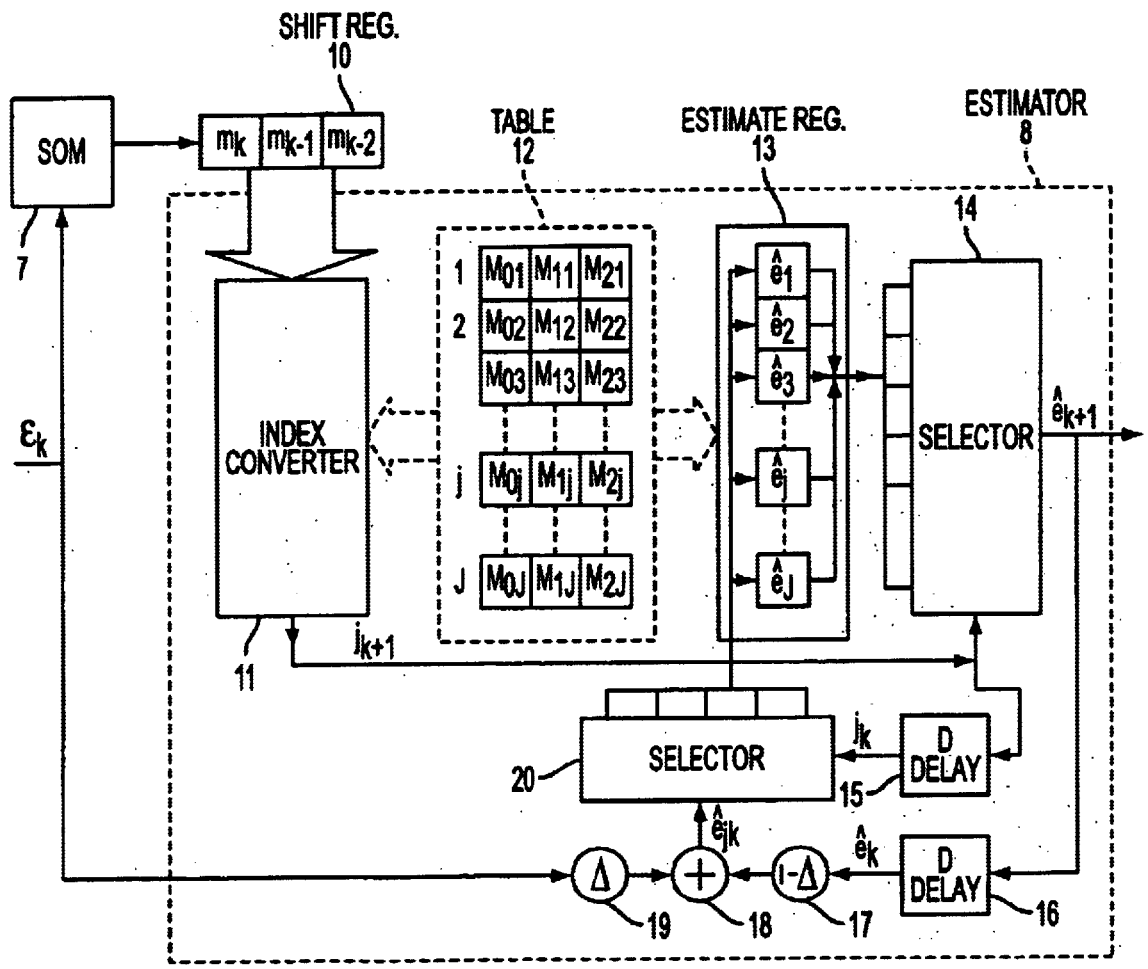
FIG. 7 shows the configuration of the estimation block according to the first embodiment of the invention.

FIG. 6 shows an interference sample point set with 16 classification points used for a QAM modulated signal. In the figure, a measured interference sample $\epsilon_k$ is classified to the point $m_k$ to which the Euclidean distance $h_k$ of the interference vector is the smallest In FIG. 6 the location of the classification points is symmetric, which may be an advantegeous initial positioning. However, when the map is updated, the location of the points is changed towards frequently occurring interference sample values.

In the case of the second embodiment, classification is done for several interference samples at a time. This can be implemented e.g. by giving each interference sample to be stored in the shift register at a particular moment of time a dimension of its own in the map. Then all samples can be handled simultaneously and in such a manner that they have an equal status. So, if the length of the shift register is 2, PAM requires a 2-dimensional map and QAM a 4-dimensional map. And if the shift register length is 3, PAM requires a 3-dimensional map and QAM a 6-dimensional map.

Next we will have a look at the operation of the estimation block 8 with reference to FIG. 7. The arrangement shown in FIG. 7 is in accord with the first embodiment of the invention, but the operation of the estimation block 23 (FIG. 4) in the second embodiment can be substantially similar to that of block 8.

Error samples $\epsilon_k$ are taken to a self-organizing map 7 which classifies the arriving sample to the closest map point c, whereby the error sample is converted into a classification result $m_k$. In addition to the value, also position index $M_i$ is associated with the classification result $m_k$. For example, when using QAM modulation, the value of the classification result is a complex number including the I and Q branch data. After the classification, the map is updated according to the SOM algorithm.

Map classification result $m_k$ is taken to a shift register 10 which contains in total the classification results $m_k$, $M_{k-1}, \ldots, m_{k-(N-1)}$ of N previous interference samples. When the values are complex numbers, the shift register comprises two separate branches for the I and Q components of the values.

Table 12 contains all possible combinations (the total number of which is J) that can be formed by taking N map points $m_i$. Associated with each combination is a specific index that takes values 1 . . . J. Associated with each combination vector of the length N there is an estimate value $\hat{e}_j$ in the estimate register 13. Let the $j^{th}$ combination be $(M_{(N-1)j}, \ldots, M_{1j}, M_{0j})$ which corresponds to the contents of the shift register 10 at the moment k. The reference unit 11 produces on the basis of table 12 and the classification data of the shift register 10 an index value j. This index value is named $j_{k+1}$ because it is used for estimating the value of the next interference sample in the signal sample. Selector 14 select an input value $\hat{e}_j$ corresponding to the index $j_{k+1}$ for the output $\hat{e}_{k+1}$. This value is subtracted from the signal sample $y_{k+1}$ in adder 3 (FIG. 3).

It should be noted that the classification result values as such do not have significance as regards the estimate selection, only the index of a classification result, ie. the order of a map point with respect to the other points. Table 12 illustrates the interrelation of the combinations, index j and estimates, and it may be a unit controlling the physical reference unit 11 and estimate register 13, or the data of the table may be included in the reference unit and estimate register.

The self-organizing map and parts of the estimation block mentioned above can be implemented with a processor or separate components, e.g. logic circuits, ASIC circuits and random access memory (RAM) circuits.

Updating of the estimate values $\hat{e}_j$ can be done on the basis of the previous interference estimate $\hat{e}_k$ and the previous index $j_k$. Since the value $\epsilon_k$ approximately corresponds to the actual interference sample value, the estimate $\hat{e}_{jk}$ can be updated using a gradient method, for example:

$$\hat{e}_{jk}=(1-\Delta)\hat{e}_k+\Delta\cdot\epsilon_k, \tag{1}$$

where $\Delta$ is a small proportional coefficient, preferably $0.01<\Delta<0.1$. Then the estimate left in each combination j is averaged, which in turn leads to a smallest square error. The estimate calculation according to formula (1) in the estimation block 8 is implemented with multiplier units 17, and 19 and an adder 18. A selector 20 feeds a new estimate value to the estimate register (table) 13. Since the estimate updating is done only when the decision has been made and a new interference sample $\epsilon$ is available, the index $j_k$ and estimate $\hat{e}_k$ have to be stored in unit delay circuits 15 and 16.

Another alternative is to use the SOM algorithm also in estimate updating. Especially when processing a QAM signal the number of estimates grows considerably, and the major part of the estimates are used only seldom. With the SOM algorithm, more estimates are updated when an estimate is used, and so the estimates are updated more quickly and more reliably.

Figure 8:
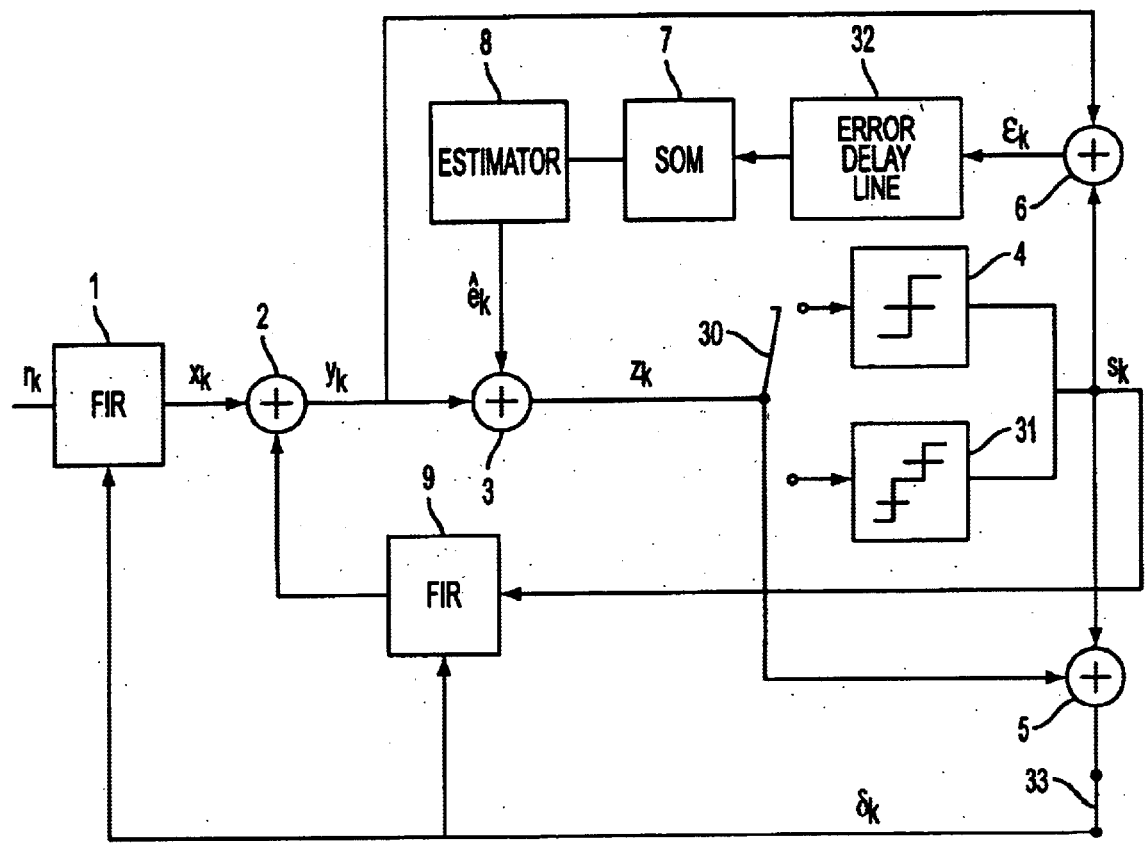
FIG. 8 shows the block diagram for the second embodiment of the method according to the invention.

FIG. 8 describes a further embodiment where intermediate sampling is used. The system receives complex signal samples $r_k$ where k is time index In this embodiment samples are taken with a double frequency compared to the symbol frequency. One sample set is taken at the ordinary timing moment, when the signal sample should be at its maximum or near to it. The second sample set is taken at the changing point of the symbols, or near to it. The signal is filtered with an adaptive transversal filter 1. The correction terms of the transversal filter are defined in the same manner as described in previous embodiments. The filtered signal $x_k$ still includes some internal interaction of the useful payload signal and some filtered interference. A feedback term generated by a DFE (Decision Feedback Equalizer) which includes adder 6 and FIR filter 9 is subtracted from the signal $x_k$ in the adder 2. The corrected signal $y_k$ at the output of the adder represents a similar DPE-corrected signal as in the previous embodiments. An interference estimate value [$e_k$] $\hat{e}_k$ is subtracted from signal $y_k$ and thus result signal $z_k$ is achieved. When the actual ideally timed sample is processed, the sample is led to the block 4 via switch 30. In block 4 a decision is made, which decision may be a usual hard decision, a soft decision with several bits or a decision made with a SOM (Self Organizing Map). A difference signal $\delta_k=z_k-s_k$ is calculated in adder 5 and the difference signal is used for implementing DFE as described above. In this case switch 33 is closed and thus connects the signal to the filters 1 and 9.

The adder calculates a difference variable $\epsilon_k=y_k-s_k$, which represents the interference (+noise) value at moment k and according to which the next interference value is predicted and an estimate value $\hat{e}_{k+1}$ is formed.

When an intermediate sample $y_{k2}$ is processed, the switch 30 is controlled to lead the intermediate samples to the decision means 31. When QPSK signal is used, the decision means is preferably a quantizer that produces 3-state decisions. This corresponds to situations where the successive samples are either of same sign or of different sign. If the samples are of the same sign a sample that is approximately +1 or −1 is achieved. If the samples are of the different sign, approximately zero is achieved. The exact values depend on the magnitude of interference and noise. These quantized results $s_{k2}$ are also led to the shift register 32 via adder 6. The switch 33 is in this case open and thus prevents the use of intermediate samples for updating the DFE terms.

In order to define estimate value $\hat{e}_{k+1}$ an N-dimensional sample vector is collected from samples $\epsilon_k$, $\epsilon_{k2}$ to the shift register 32. A classification is performed in the map 7 using the complete vector by connecting the vector to the point $m_i$ on the map, where the euclidian distance between the vector and point $m_i$ is shortest. Each decision point $m_i$ on the map corresponds to an estimate value $\hat{e}_{k+1}$ and this value is subtracted from sample y in the adder 3. As the next sample is received to the shift register, the oldest value is removed and the closest point is searched from the map based on the new content of the shift register. The estimates are connected to the points of the classifying block 7 in the block 8 as previously described.

The benefit of this embodiment is that the intermediate samples include information of the interference value, which is quite near in time and can be used to predict the interference estimate at the distance of half symbol cycle.

In the embodiments described above, the estimates corresponding to all state combinations are put into a table. To make the table smaller, it is possible to include only the estimate values that correspond to the states in which the estimate values are the biggest. Those combinations which have no estimate associated with them can be assigned a zero estimate. Then the need for memory is smaller, but on the other hand, the estimate updating algorithm is more complicated.

Possible embodiments of the invention have been described above in connection with a general complex QAM signal. Naturally, the method can also be applied to signals of other types. Especially, for a PAM modulated signal the method can be implemented by replacing the complex numbers associated with the signal sample with real numbers, in which case it is possible to use one signal branch only.

The circuit arrangements shown in FIGS. 3 and 4 include a conventional transversal filter and a DFE equalizer. These are not necessary in the method according to the invention, even though they make the use of the invention more effective is most applications. It is also possible to use other, both linear and non-linear equalizers depending on the application.

The embodiments of the invention described above are implemented with a self-organizing map. However, the invention is not limited to the use of a self-organizing map, or SOM algorithm, but the method according to the invention can be implemented using other adaptive methods as well, especially neural methods. Other neural methods suitable for classification are e.g. the multilayer perceptron (MLP) method and the radial basis function (RBF) method. Neural methods are described in greater detail in

[4] Simon Haykin, Neural Networks, A Comprehensive Foundation, Macmillan Publishing Company, 866 Third Avenue, New York, 1994.

Above there has been described the use of the method according to the invention in transmission systems in which communication occurs between separate devices, such as a mobile station and a base station. However, the invention is widely applicable to all devices and systems that deal with digital signals The invention can be applied, for example, in digital instruments or reading devices to compensate for external and internal interference, thereby improving the reliability of measurement especially in noisy environments.

What is claimed is:

1. A method for compensating for an interfering signal included in an input signal ($r_{k+1}$) carrying a digital payload signal to obtain an interference-compensated signal ($z_{k+1}$), comprising the steps of:

producing an interference estimate ($\hat{e}_{k+1}$) for an interfering signal sample value;

predicting from said interference estimate ($\hat{e}_{k+1}$) a next sample value for the interfering signal;

subtracting said interference estimate ($\hat{e}_{k+1}$) from a signal sample ($y_{k+1}$) of an uncompensated signal derived from said input signal ($r_{k+1}$);

making a decision ($s_{k+1}$) on a sample value of the interference-compensated signal ($z_{k+1}$);

wherein said producing step includes a step of adaptively forming said interference estimate ($\hat{e}_{k+1}$) as a function of at least one previous decision value ($s_k$) of said decision and at least one previous signal sample ($y_k$) of said uncompensated signal.

2. The method of claim 1, wherein said adaptive forming step is accomplished by a neural network.

3. The method of claim 1, wherein a previous sample ($\epsilon_k$) of said interfering signal is measured by calculating a difference of said previous decision and the corresponding uncompensated signal sample ($y_k$).

4. The method of claim 1, further comprising the steps of equalizing and delaying said input signal ($r_{k+1}$) before the subtraction of the interference estimate ($\hat{e}_{k+1}$) from the uncompensated signal ($y_{k+1}$) to accomplish said interference compensation.

5. The method of claim 1, wherein, in said step of producing said interference estimate ($\hat{e}_{k+1}$), said producing employs the output value ($s_{k+1}$) corresponding to at least one intermediate decision ($s_{k2}$) of said decision making step.

6. The method of claim 1, further comprising a step of transmitting the interference-compensated signal ($z_{k+1}$) in a transmission system conveying the interference-compensated signal as a digitally modulated signal suitable for use in a mobile communication system, radio system or television system.

7. A method for compensating for an interfering signal included in an input signal ($r_{k+1}$) carrying a digital payload signal to obtain an interference-compensated signal ($z_{k+1}$), comprising the steps of:

producing an interference estimate ($\hat{e}_{k+1}$) for an interfering signal sample value;

predicting from said interference estimate ($\hat{e}_{k+1}$) a next sample value for the interfering signal;

subtracting paid interference estimate ($\hat{e}_{k+1}$) from a signal sample ($y_{k+1}$) of an uncompensated signal derived from said input signal ($r_{k+1}$);

making a decision ($s_{k+1}$) on a sample value of the interference-compensated signal ($z_{k+1}$);

wherein said producing step includes a step of adaptively forming said interference estimate ($\hat{e}_{k+1}$) as a function of at least one previous decision value ($s_k$) of said decision and at least one previous signal sample ($y_k$) of said uncompensated signal; and interference samples ($\epsilon_k$, $\epsilon_{k+1}$, . . . $\epsilon_{k-(N-1)}$) of said interfering signal are matched to a self-organizing map to convert, or classify, the interference samples into map points ($m_k$, $m_{k-1}$, . . . , $m_{k-(N-1)}$).

8. The method of claim 7, wherein the interference samples ($\epsilon_k$, $\epsilon_{k-1}$, . . . $\epsilon_{k-(N-1)}$) are converted into the map points ($m_k$, $m_{k-1}$, . . . , $m_{k-(N-1)}$) in the following stages:

one of the interference samples ($\epsilon_k$) is fed into the self-organizing map, the interference sample is matched to one of the map points ($m_k$) having the shortest Euclidian distance to the interference sample, the map point ($m_k$) is fed into a first shift register to produce a stored sequence of map points ($m_k$, $m_{k-1}$, ..., $m_{k-(N-1)}$), and updating the map.

9. The method of claim 7, wherein at least part of the combinations ($M_{(N-1)j}$, ..., $M_{1j}$, $M_{oj}$) are map points of the self organizing map and are logically associated with corresponding estimates ($ê_j$) stored in an estimate register.

10. The method of claim 9, wherein the estimates ($ê_j$) in the register correspond with the map points ($m_k$, $m_{k+1}$, ..., $m_{k-(N-1)}$) of the map points ($m_k$, $m_{k-1}$, ..., $m_{k-(N-1)}$) obtained from the interference samples ($\epsilon_k$, $\epsilon_{k-1}$, ... $\epsilon_{k-(N-1)}$) is used as a next interference estimate ($ê_k$).

11. The method of claim 10, further comprising a step of updating the value of the estimate ($ê_{j+1}$) used as the interference estimate before selecting the next interference estimate.

12. The method of claim 11, wherein the updating of the estimate value is done by using substantially a gradient method.

13. The method of claim 12, wherein the estimate register provides a self-organizing map (SOM), and the estimate values of the neighborhood of the selected estimate ($ê_{j+1}$) are updated using substantially a SOM algorithm.

14. The method of claim 12, wherein the updating of the self-organizing map (SOM) is accomplished by using substantially the SOM algorithm.

15. The method of claim 7, wherein conversion of the interference samples ($\epsilon_k$, $\epsilon_{k-1}$, ... $\epsilon_{k-(N-1)}$) into the map points ($m_k$, $m_{k-1}$, ..., $m_{k-(N-1)}$) is done in the following stages:

N last interference samples of a set of the interference samples ($\epsilon_k$, $\epsilon_{k-1}$, ... $\epsilon_{k-(N-1)}$) are stored in a second shift register, an interference sample vector for the set of the interference samples ($\epsilon_k$, $\epsilon_{k-1}$, ... $\epsilon_{k-(N-1)}$) is formed of the interference samples stored in the second shift register, and the vector is fed into the self organizing map, the self organizing map being N-dimensional, the interference sample vector fed into the map is matched to a map point having the shortest Euclidian distance to the interference sample vector in order to convert the interference sample vector into a classification result vector of the map points ($m_k$, $m_{k-1}$, ..., $m_{k-(N-1)}$), and updating the map.

16. The method of claim 15, wherein at least part of the points of the self-organizing map are logically associated with corresponding estimates ($ê_j$) in an estimate register.

17. The method of claim 16, wherein a further estimate ($ê_{j+1}$) in the estimate register corresponding to the map point of the classification result vector ($m_k$, $m_{k-1}$, ..., $m_{k-(N-1)}$) obtained from the last interference samples of the set of the interference samples ($\epsilon_k$, $\epsilon_{k-1}$, ... $\epsilon_{k-(N-1)}$) is used as a next interference estimate ($ê_{k+1}$).

18. A circuit arrangement for compensating for an interfering signal included in an input signal ($r_k$) carrying a digital payload signal, including:

decision means, and means for producing an interference estimate ($ê_{k+1}$);

means for subtracting said interference estimate from a signal sample ($y_{k+1}$) of an uncompensated signal derived from said input signal;

a decision circuit for making a decision ($s_{k+1}$) on an interference-compensated signal ($z_{k+1}$);

wherein said means for producing the interference estimate ($ê_{k+1}$) comprises means for adaptively determining the interference estimate ($ê_{k+1}$) on the basis of at least one previous uncompensated signal sample ($y_k$) and at least one previous decision ($s_k$) of said decision means; and said adaptive determining means comprises means for subtracting said interference estimate ($ê_{k+1}$) from said previous uncompensated signal sample ($y_k$) to provide an input signal to said decision means.

19. The circuit arrangement of claim 18, further comprising;

means for measuring an interference sample ($\epsilon_k$), means for adaptively classifying the interference sample ($\epsilon_k$), and converting the interference sample ($\epsilon_k$) into a map point ($m_k$), and means for determining the next one of an interference estimate ($ê_{k+1}$) as a function of the map point ($m_k$).

20. The circuit arrangement of claim 18, further comprising a FIR filter for equalizing delayed payload signal components before compensation of the interference signal.

21. The circuit arrangement of claim 18, further comprising a decision feedback equalizer for equalizing delayed payload signal components, said decision feedback equalizer comprising:

means for forming the difference of a decision circuit input and output for a decision error, a FIR filter for forming a weighted sum of previous decisions constituting an equalization value on the basis of the decision error and a decision value, and means for subtracting the decision value from the input signal before compensation of the interfering signal and a making of the decision.

22. The circuit arrangement of claim 18, further comprising means for forming at least one intermediate decision ($s_{k2}$) and means for forming the interference estimate ($ê_{k+1}$) as a function of said at least one intermediate decision ($s_{k2}$).

23. The circuit arrangement of claim 18, wherein said circuit arrangement is part of a transmission system conveying a digitally modulated signal; suitable for use as a mobile communication system, radio system, or television system.

24. A circuit arrangement for compensating for an interfering signal included in an input signal ($r_k$) carrying a digital payload signal, including:

decision means, and means for producing an interference estimate ($ê_{k+1}$);

means for subtracting said interference estimate from a signal sample ($y_{k+1}$) of an uncompensated signal derived from said input signal;

a decision circuit for making a decision ($s_{k+1}$) on an interference-compensated signal ($z_{k+1}$);

means for measuring an interference sample ($\epsilon_k$);

means for adaptively classifying the interference sample ($\epsilon_k$), and converting the interference sample ($\epsilon_k$) into a map point ($m_k$); and means for determining the next one of an interference estimate ($ê_{k+1}$) as a function of the ma pint ($m_k$);

wherein said means for producing the interference estimate ($ê_{k+1}$) comprises means for adaptively determining the interference estimate ($ê_{k+1}$) on the basis of at least one previous uncompensated signal sample ($y_k$) and at least one previous decision ($s_k$); and wherein said means for adaptively classifying the interference sample ($\epsilon_k$) include a self organizing map.

25. The circuit arrangement of claim 24 further comprising a shift register for storing the last interference samples of a set of interference samples ($\epsilon_k, \epsilon_{k-1}, \ldots \epsilon_{k-(N-1)}$), and wherein the self-organizing map includes dimensions for two or more interference samples stored in the second shift register.

26. A circuit arrangement for compensating for an interfering signal included in an input signal ($r_k$) carrying a digital payload signal, including:

decision means, and means for producing an interference estimate ($\hat{e}_{k+1}$);

means for subtracting said interference estimate from a signal sample ($y_{k+1}$) of an uncompensated signal derived from said input signal;

a decision circuit for making a decision ($s_{k+1}$) on an interference-compensated signal ($z_{k+1}$);

means for measuring an interference sample ($\epsilon_k$);

means for, adaptively classifying the interference sample ($\epsilon_k$), and converting the interference sample ($\epsilon_k$) into a map point ($m_k$); and means for, determining the next one of an interference estimate ($\hat{e}_{k+1}$) as a function of the map point ($m_k$);

wherein said means for producing the interference estimate $\hat{e}_{k+1}$) comprises means for adaptively determining the interference estimate $\hat{e}_{k+1}$ on the basis of at least one previous uncompensated signal sample ($y_k$) and at least one previous decision ($s_k$); and a shift register for storing a succession of map points ($m_k, m_{k-1}, \ldots, m_{k-(N-1)}$) for determining the interference estimate ($\epsilon_{k+1}$).

27. A circuit arrangement for compensating for an interfering signal included in an input signal ($r_k$) carrying a digital payload signal, including:

decision means, and means for producing an interference estimate ($\hat{e}_{k+1}$);

means for subtracting said interference estimate from a signal sample ($y_{k+1}$) of an uncompensated signal derived from said input signal;

a decision circuit for making a decision ($s_{k+1}$) on an interference-compensated signal ($z_{k+1}$);

means for measuring an interference sample ($\epsilon_k$);

means for adaptively classifying the interference sample ($\epsilon_k$), and converting the interference sample ($\epsilon_k$) into a map point ($m_k$); and means for determining the next one of an interference estimate ($\hat{e}_{k+1}$) as a function of the map point ($m_k$);

wherein said means for producing the interference estimate ($\hat{e}_{k+1}$) comprises means for adaptively determining the interference estimate ($\hat{e}_{k+1}$) on the basis of at least one uncompensated signal sample ($y_k$) and at least one previous decision ($s_k$);

an estimate register with estimate values ($\hat{e}_j$) therein, and means for selecting the estimate values ($\hat{e}_j$) from the estimate register on the basis of one or more previous map points ($m_k$) for the interference estimate ($\hat{e}_{k+1}$).

28. The circuit arrangement of claim 27, further comprising means for updating the estimate values ($\hat{e}_j$) stored in the estimate register.

29. A method for compensating for an interfering signal included in an input signal ($r_{k+1}$) carrying a digital payload signal to obtain an interference-compensated signal ($z_{k+1}$), comprising the steps of:

producing an interference estimate ($\hat{e}_{k+1}$) for an interfering signal sample value;

predicting from said interference estimate ($\hat{e}_{k+1}$) a next sample value for the interfering signal;

subtracting said interference estimate ($\hat{e}_{k+1}$) from a signal sample ($y_{k+1}$) of an uncompensated signal derived from said input signal ($r_{k+1}$);

making a decision ($s_{k+1}$) on a sample value of the interference-compensated signal ($z_{k+1}$);

wherein said producing step includes a step of adaptively forming said interference estimate ($\hat{e}_{k+1}$) as a function of at least one previous decision value ($s_k$) of said decision and at least one previous signal sample ($y_k$) of said uncompensated signal; and storing points of a map based on decisions of said decision-making step, and updating a set of said points as a self-organizing map for producing values of the interference estimate ($\hat{e}_{k+1}$).

30. A circuit arrangement for compensating for an interfering signal included in an input signal ($r_k$) carrying a digital payload signal, including:

decision means, and means for producing an interference estimate ($\hat{e}_{k+1}$);

means for subtracting said interference estimate from a signal sample ($y_{k+1}$) of an uncompensated signal derived from said input signal;

a decision circuit for making a decision ($s_{k+1}$) on an interference-compensated signal ($z_{k+1}$);

wherein said means for producing the interference estimate ($\hat{e}_{k+1}$) comprises means for adaptively determining the interference estimate ($\hat{e}_{k+1}$) on the basis of at least one uncompensated signal sample ($y_k$) and at least one previous decision ($s_k$) of said decision means; and said adaptive determining means comprises means for subtracting said interference estimate ($\hat{e}_{k+1}$) from said uncompensated signal sample ($y_k$) to provide an input signal to said decision means, and map means operative on output signals of said decision means as a self-organizing map for producing values of the interference estimate ($\hat{e}_{k+1}$).

* * * * *

UNITED STATES PATENT AND TRADEMARK OFFICE
CERTIFICATE OF CORRECTION

PATENT NO. : 6,754,293 B1
DATED : June 22, 2004
INVENTOR(S) : Henriksson et al.

It is certified that error appears in the above-identified patent and that said Letters Patent is hereby corrected as shown below:

Column 10,
Line 44, "paid" should read -- said --.
Line 54, "$(\in_k, \in_{k+1}, ... \in_{k-(N-1)})$" should read -- $(\in_k, \in_{k-1}, ... \in_{k-(N-1)})$ --.

Column 11,
Line 10, "$(m_k, m_{k+1}, ..., m_{k-(N-1)})$" should read -- $(m_k, m_{k-1}, ..., m_{k-(N-1)})$ --.
Line 25, "claim 12" should read -- claim 13 --.

Column 12,
Line 57, "ma pint" should read -- map point --.

Column 13,
Lines 22 and 23, "$\hat{e}_{k+1})$" should read -- $(\hat{e}_{k+1})$ --.

Signed and Sealed this

Twenty-eighth Day of September, 2004

JON W. DUDAS
*Director of the United States Patent and Trademark Office*